United States Patent [19]
Cresswell et al.

[11] Patent Number: 5,247,262
[45] Date of Patent: Sep. 21, 1993

[54] LINEWIDTH MICRO-BRIDGE TEST STRUCTURE

[75] Inventors: Michael Cresswell, Frederick; Richard Allen, Germantown; Loren Linholm, Ijamsville, all of Md.

[73] Assignee: The United States of America as represented by the Secretary of Commerce, Washington, D.C.

[21] Appl. No.: 852,367

[22] Filed: Mar. 13, 1992

[51] Int. Cl.$^5$ .......................................... G01R 27/26
[52] U.S. Cl. .................................................... 324/716
[58] Field of Search ............... 324/716, 158 R, 158 D, 324/713, 715

[56] References Cited

U.S. PATENT DOCUMENTS

| | | | |
|---|---|---|---|
| 3,781,911 | 12/1973 | Davidson | 324/65 R |
| 3,808,527 | 4/1974 | Thomas | 324/716 |
| 3,974,443 | 8/1976 | Thomas | 324/716 |
| 4,347,479 | 8/1982 | Cullet | 324/716 |
| 4,516,071 | 5/1985 | Buehler | 324/716 |
| 4,797,604 | 1/1989 | Rocci et al. | 324/65 R |
| 4,803,420 | 2/1989 | Steinbrecher et al. | 324/64 |
| 4,871,962 | 10/1989 | Cheung | 324/65 R |
| 4,978,923 | 12/1990 | Maltiel | 324/693 |

FOREIGN PATENT DOCUMENTS 1084701 4/1984 U.S.S.R. ............................... 324/716

OTHER PUBLICATIONS

J. Electrochemical Society vol. 125 No. 4 Apr. 1978 Bridge and van der Pauw Sheet Resistors for Characterizing the Line Width of Conducting Layers Buehler et al.

Martin, David, "Electrical measurements of overlay using the Prometrix Lithomap LM20", SPIE, Integrated Circuit Metrology, Inspection and Process Control IV, vol. 1261, pp. 402-413, Dec. 1990.

Feldbaumer, David Wm., et al. "Design and Application of the Interlayer van der Pauw Resistor Alignment Bridge", IEEE Transactions on Semiconductor Manufacturing, vol. 3, No. 4 Nov. 1990, pp. 206-215.

Thomas, Donald R., et al., "An Electrical Photolithographic Alignment Monitor", IBM Corp., Jun. 1974.

Perloff, David S., "A Van der Pauw Resistor Structure for Determining Mask Superposition Errors on Semiconductor Slices", Solid State Electronics, vol. 21, pp. 1013-1015.

Russell, T. J., et al. "A Comparison of Electrical and Visual Alignment Test Structures for Evaluating Photomask Alignment in Integrated Circuit Manufacturing", Technical Digest, Washington, D.C., Dec. 5-7, 1977.

Lozano, M. et al., "Improvement of the Triangular MOS Transistor for Misalignment Measurement", Proc. IEEE 1991 Int. Conference on Microelectronic Test Structures, vol. 4, No. 1, Mar. 1991, pp. 119-122.

Primary Examiner—Kenneth A. Wieder
Assistant Examiner—Maura K. Regan
Attorney, Agent, or Firm—Michael deAngeli

[57] ABSTRACT

A test structure pattern and method for processing the electrical data extracted from the pattern which allows for the measurement of a short line with a precision on the order of 10 nanometers.

6 Claims, 2 Drawing Sheets

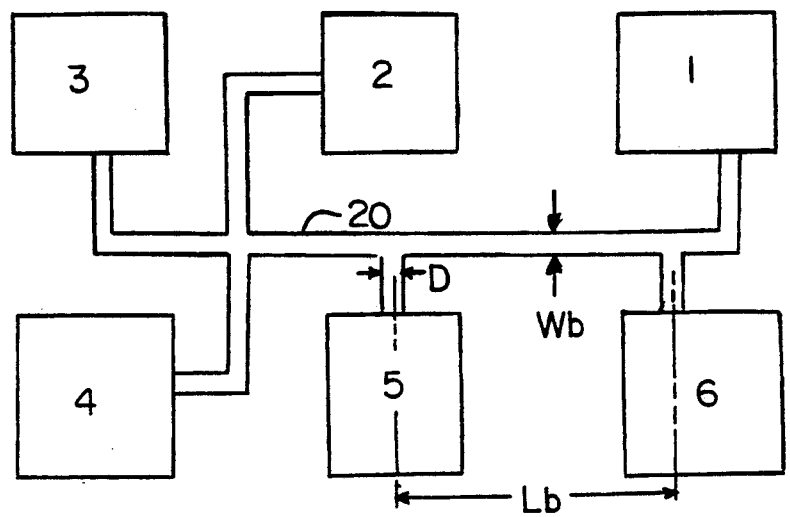
PRIOR ART    FIG. 1
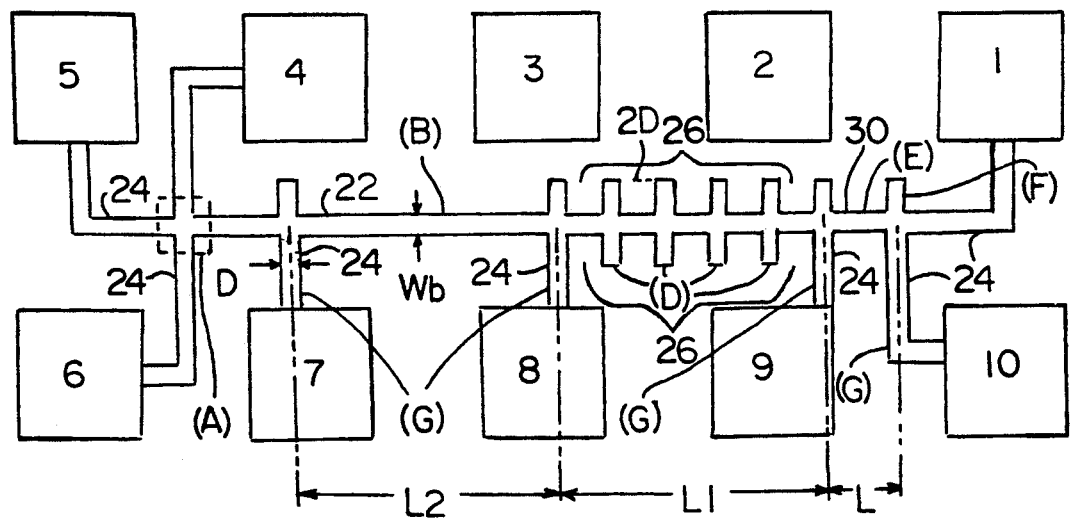
FIG. 2

LINEWIDTH MICRO-BRIDGE TEST STRUCTURE

BACKGROUND OF THE INVENTION

1. Technical Field

This invention relates to a test structure pattern and a method of processing the electrical data extracted from it enabling the measurement of the width of thin-film conductors formed on substrates down to approximately 5 microns in length with precision of the order of one nanometer.

2 DESCRIPTION OF THE PRIOR ART

The prior art is limited to structures which obtain measurements requiring a very long line to eliminate measurement uncertainties. However, these long lines also provide the undesired side effect of averaging out any local non-uniformities in the line being measured.

A typical method for determining the width of a thin film conductor is by use of the cross-bridge resistor (see Ref. 1) (FIG. 1), where the linewidth is $W_0$ determined by:

$$W_b = \frac{R_s L_b}{R_b} \quad (1)$$

where $R_b$ is the resistance of the bridge (that is, of the thin-film conductor 20 between pads 5 and 6), $R_S$ is the sheet resistance of the conducting material, as measured using the van der, Pauw cross portion of the test structure extending between pads 2, 3, 4 and 5, and $L_b$ is the length of the bridge. However, Eq. (1) presumes an ideal, uniform the linewidth $W_{bt}$ corrected for current shunting at finite width voltage taps such as extending between pad 5 and line 20 is given by $$W_{bt} = \frac{W_b}{1 - E} \quad (2)$$

where the correction E is given by [2]

$$E = \left(\frac{2W_b}{\pi L_b}\right)\left[\left(\frac{D}{W_b}\right)\tan^{-1}\left(\frac{D}{2W_b}\right) - \ln\left(1 + \left(\frac{D}{2W_b}\right)^2\right)\right] \quad (3)$$

That is, the correction E provides compensation for lower resistance and increased electron flow past the taps, such that $W_{bt}$ correctly reflects the width of the bridge.

However, it has long been realized that a useful result for the correction can be obtained using equations (2) and (3) only where D, $W_b$, and $W_S$ are known and are fabricated with exact 90° corners, (i.e., in no real or practical case). Historically, equation (3) has been used to create guideline design rules that minimize E so $W_{bt}$ is approximately equal to $W_b$. This is done by designing the test structure such that $W_b \approx D$ and $L_b >> W_b$. Typical design rules require that for a bridge with $W_b = 1$ μm, $L \geq 80$ μm. The requirement of such long lines precludes detection of local variations in the linewidth. Therefore the prior art test structure and method are incapable of accurate characterization of short conductors, as are commonly employed.

Those concerned with these and other problems recognize the need for a test structure pattern and a method of processing the electrical data extracted from it that enables the measurement of the width of a short line with precision.

DISCLOSURE OF THE INVENTION

The present invention provides a novel test structure pattern and a method of processing the electrical, data extracted from it that enables the measurement of the width of a short conductor or "line" with precision of the order of 10 nanometers. The test structure is replicated in a conducting film on an insulating substrate, using a short line to provide information on possible local non-uniformities of the linewidth. The test structure of the invention includes supplementary geometric features enabling determination of a precise value for the effect of voltage taps extending from the conductor. The method of the invention corrects for deficiencies that have previously prevented the use of similar methods and structures for nanometer-level metrology applications.

An object of the present invention is the provision of a linewidth micro-bridge test structure that uses "dummy" taps to measure the effect of a tap.

Another object is to provide a linewidth micro-bridge test structure that has an ability to use an arbitrarily short line to
y long line. measure the width, rather than using an extremel A further object of the invention is the provision of a linewidth micro-bridge test structure that corrects deficiencies that have previously prevented the use of similar methods and structures for nanometer-level metrology applications.

BRIEF DESCRIPTION OF THE DRAWINGS

These and other attributes of the invention will become more clear upon a thorough study of the following description of the best mode for carrying out the invention, particularly when reviewed in conjunction with the drawings, wherein:

FIG. 1 is a diagrammatic illustration of a prior art cross-bridge resistor test structure;

FIG. 2 is a diagrammatic illustration of a comparable linewidth micro-bridge test and structure according to the invention.

BEST MODE FOR CARRYING OUT THE INVENTION

Figure 3:
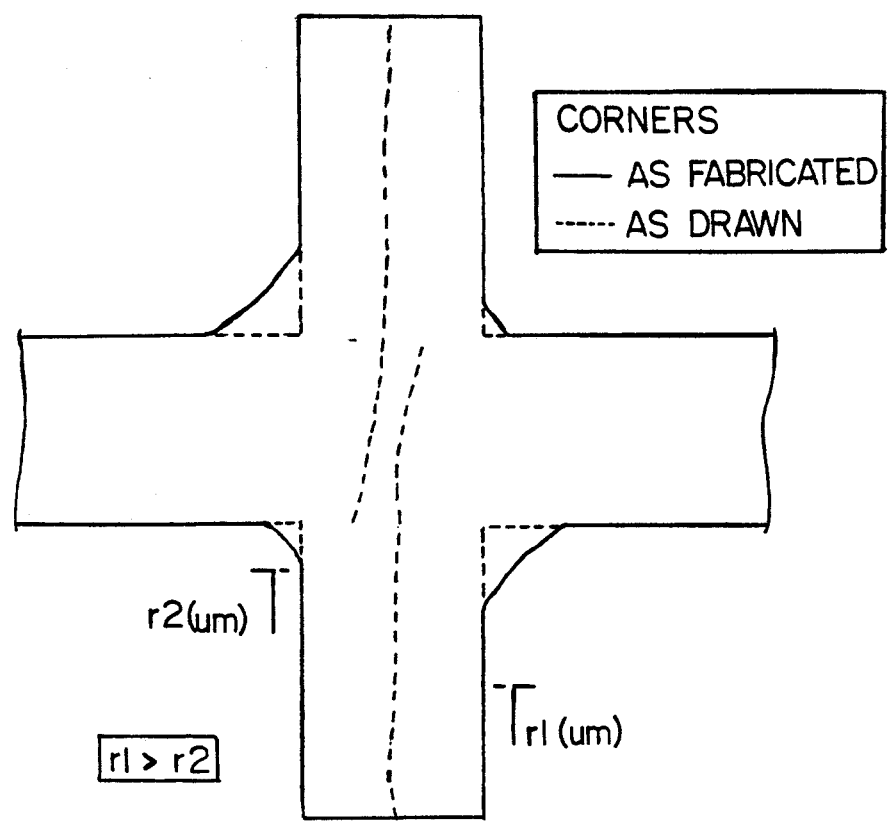
FIG. 3 is a diagrammatic illustration of a measurement of the voltage from opposite sides of a single, asymmetric tap.

Referring now to the drawings, wherein like reference numerals designate identical or corresponding parts throughout the several views, FIG. 2 shows a linewidth test structure according to one embodiment of the present invention. The embodiment shown in FIG. 2 was chosen for clarity in presenting the features of the present invention.

The test structure according to the invention consists of a long conductor 22 connected by active voltage taps 24 to a number of pads 1 and 4-10 in a specific configuration, and also including dummy taps 26 not connected to any pads. By forcing several currents along the various segments of the conductor, and measuring voltages between the various taps, the sheet resistance and the linewidth of this structure can be determined.

The principal features of the structure of FIG. 2 are identified by reference characters (A)–(G). These features include the following: (A) A van der Pauw cross for measurement of the sheet resistance of the conducting film. This cross can be of any of the accepted designs for the van der Pauw cross (see Refs. 1 and 3) such as the Greek Cross extending between pads 4, 5, 6 and 7 in FIG. 2; (B) A line segment of a length L1 with no intermediate taps; (C) A line segment of a length L2 (for convenience in data analysis, L2 may be designed to the same value as L1) having a number of dummy taps 26 formed therealong; (D) A number of "dummy" taps (i.e., not used to measure the voltage at a particular point along the line, but used to emulate the effect of a real voltage tap on the line) along the length of segment (C); (E) One or more short bridge resistors 30, i.e., short segments of the conductor; (F) All voltage taps (both the taps used as "dummy" taps and those used for voltage measurement) extending over both sides of the wire by an amount at least twice their width; and (G) all voltages being measured at pads connected to taps extending from the same side of the long wire 22.

The van der Pauw cross (A) is a well known and widely used test structure for determining the sheet resistance $R_S$ of a conducting film. See Refs. 1 and 3. In the structure of FIG. 2, measurement of resistance using the van der Pauw cross (A) is performed as follows: A current I is forced between pads 5 and 6 and the voltage V47+ is measured between pads 4 and 7. The current is then reversed and the voltage V47− is measured. The current I is then forced between pads 4 and 5 and the voltage V67+ is measured between pads 7 and 6. The current is reversed voltage V47− is measured. V, the average of the magnitudes of the voltage V47+, V47−, V67+, and V67−, is calculated. The sheet resistance $R_s$ calculated using the formula $$R_s = \frac{\pi}{\ln 2}\left(\frac{V}{I}\right) \quad (4)$$

This method of calculating $R_S$ is shown by Refs. 1 and 3, among others. As noted above, it is impossible as a practical matter to calculate the linewidth $W_b$ responsive to $R_S$ in compact structure (that is, unless $L_2 >> W_b$) where voltage taps 24 and present. According to the present invention, feature (C) is added to the basic van der Pauw structure and used to determine the change in the effective electrical "length" of the conductor (i.e. the reduced resistance) due to a single voltage tap. The only difference between Features (B) and (C) is the presence of the "dummy" taps 26, Feature (D), crossing a further segment of conductor 22, that is, Feature (C). Accordingly, comparison of the resistance of a segment of conductor 22 of length L2 without dummy taps (i.e., feature B) to a segment of length L1 including dummy taps 26 (Feature C) provides a direct meansure of the effect of taps 24 connecting the conductor 22 to the various pads. More specifically, the dummy taps 26 provided according to the invention emulate the electrical length modulation, δL, of a single voltage tap 24.

Calculation of δL is performed as follows: (a) a current +I is forced between pads 5 and 1 and the voltages V78+ (the voltage between pads 7 and 8 for a current of +I) and V89+ are measured. (b) The current is reversed and the voltages V78− and V89− measured. (c) The voltage V78 is calculated as the average of the magnitudes of V78+ and V78−. (d) The voltage V89 is measured in a similar manner. (e) δL is calculated using the formula $$\delta L = \frac{L1\, V78 - L2\, V89}{(n+1)\, V78 - V89} \quad (5)$$

where n is the number of "dummy" taps.

The value δL allows compensation of any measured length, e.g., $L_1$, $L_2$ or L, for the presence of taps. For example, using this value, the effective electrical length $L_e$ of bridge 30, i.e., Feature (E) can be calculated as follows:

$$L_e = L - \delta L \quad (6)$$

To extract the linewidth $W_b$ of bridge 30, i.e., feature (E), the resistance $R_b$ of the bridge is first measured, as follows: (a) A current +I is forced between pads 5 and 1 and the voltage V910+ (between pads 9 and 10) is measured. (b) The current −I is then forced and is reversed and the voltage V910− is measured. (c) The voltage V910 is calculated as the average of the magnitudes of V910+ and V910−. (d) The bridge resistance $R_b$ is calculated using the formula $$R_b = \frac{V910}{I} \quad (7)$$

$$W_b = \frac{R_s L_e}{R_b} \quad (8)$$

The same steps are carried out in calculation of $W_b$ at any point of interest in the structure in accordance with the objects of the invention.

Feature (F), provision of taps crossing the main conductor 22, and feature (G), measuring all voltages from voltage taps on the same side of the current-carrying wire, are used in conjunction to minimize or eliminate possible effects due to asymmetric voltage taps. Asymmetric voltage taps can be introduced in the fabrication process, when the physical shape of voltage taps on one side of the current-carrying conductor differ from those on the other side of the conductor. Provision of crossing taps according to the invention elminates possible differences in the values of δL for taps extending off opposite sides of the conductor, and allows measurements to be made from either side of conductor 22. All measurements are made at pads connected to taps on the same side, so that if there is systematic asymmetric corner rounding, as frequently occurs in fabrication, the voltage measured at each tap is taken at the same relative point along the conductor 22. Accordingly, any measurement errors due to systematic irregularities in fabrication tend to cancel one another out, (see FIG. 3, for a graphic description of how taps on different sides of the conductor in the asymmetric case measure different voltages.

In addition, by using crossing taps, the effect of a single tap is increased by almost a factor of two, allowing for a minimum number of "dummy" taps 26 according to the invention and therefore minimization of length L1.

Thus, it can be seen that at least all of the stated objectives have been achieved.

Obviously, many modifications and variations of the present invention are possible in light of the above teachings. It is therefore to be understood that, within the scope of the appended claims, the invention may be practiced otherwise than as specifically described.

REFERENCES

1. Buehler, M.G. Grant, S.D. and Thurber, W.R., "Bridge and van der Pauw Sheet Resistors for Characterizing the Line Width of Conducting Layers," J. Electrochem. Soc.. Vol. 125, pp. 650-54, April 1978.
2. Hall, P.M., "Resistance Calculations for Thin Film Patterns," Thin Solid Films, Vol. 1, pp. 227-95 (1967-8).
3. Buehler, M.G., and Thurber, W.R., "An Experimental Study of Various Cross Sheet Resistor Test Structures," J. Electrochem. Soc., Vol. 125, pp. 645-50, April 1978.
4. Cresswell, M.W., Gaitan, M., Allen, R.A., and Linholm, L.W., "A Modified Sliding Wire Potentiometer Test Structure for Mapping Nanometer-Level Distances," Proc. 1991 ICMTS, pp. 129-134, March 1991.

We claim:
1. In combination,
   (1) a conductive film on a substrate forming a microbridge test structure, said structure comprising:
      (a) a van der Pauw cross for measurement of the sheet resistance $R_S$ of said conducting film;
      (b) a first line segment having a length $L_1$, delimited by active voltage taps at either end, said second line segment incorporating a plurality of intermediate dummy taps along the length of said second line segment, wherein said dummy taps are utilized to emulate the effect of one or more active voltage taps on said first line segment; and
      (c) a second line segment having a length $L_2$ delimited by active voltage taps at either end with no intermediate taps;
   (2) voltage measuring means for measuring voltages at the various active voltage taps extending from said line segments;
   (3) means for determining a conductor length compensating factor $\delta L$ responsive to measurement of the respective voltages across said first and second line segments;
   (4) means for determining the bridge resistance $R_b$ of a line segment of interest of length L; and
   (5) means for determining the width $W_b$ of said line segment of interest of length L responsive to the following:

$$W_b = \frac{R_s(L - \delta L)}{R_b}$$

2. The combination of claim 1, wherein said voltage taps extend from the respective line segments by a distance equal to at least twice their width.
3. The combination of claim 1, wherein said voltage taps cross the respective line segments.
4. The method of claim 1, wherein said voltage measuring means is connected to pads connected to taps extending from a single side of said first and second line segments.
5. A method of determining the line width $W_b$ of a conductor of length L comprised by a test structure formed on a substrate, said method comprising the steps of:
   forming said test structure as a thin film of electrically conductive material on a substrate, such that said conductor comprises a first section delimited by taps at its respective ends and further comprising one or more dummy taps intermediate said ends, and a second section delimited by taps at its respective ends;
   determining the sheet resistance $R_S$ of the conductive film;
   determining the bridge resistance $R_b$ of a section of said conductor;
   measuring the respective voltage drops across said first and second sections responsive to current passed therethrough;
   determining a conductor length correction factor $\delta L$ responsive to said respective voltage drops, and proportional to the number of said dummy taps intermediate the ends of said first section; and
   calculating $W_b$ according to the following:

$$W_b = \frac{R_s(L - \delta L)}{R_b}$$

6. The method of claim 5, wherein $\delta L$ is determined according to the following equation:

$$\delta L = \frac{L_1 V_{23} - L_2 V_{21}}{(n + 1) V_{23} - V_{12}}$$

wherein:
$V_{12}$ is a voltage measured between taps at respective ends of said first section;
$V_{23}$ is a voltage measured between taps at respective ends of said second section;
$L_1$ is the length of said first section;
$L_2$ is the length of said second section; and
n is the number of dummy taps in said first section.

* * * * *